(12) United States Patent
DeTemple et al.

(10) Patent No.: US 6,194,833 B1
(45) Date of Patent: *Feb. 27, 2001

(54) MICRODISCHARGE LAMP AND ARRAY

(75) Inventors: Thomas A. DeTemple; James Frame, both of Champaign; David J. Wheeler, Urbana; J. Gary Eden, Mahomet, all of IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/177,196

(22) Filed: Oct. 22, 1998

Related U.S. Application Data

(63) Continuation-in-part of application No. 08/858,235, filed on May 19, 1997, now Pat. No. 6,016,027.

(51) Int. Cl.[7] .................................................. H01J 17/04

(52) U.S. Cl. ........................... 313/631; 313/356; 313/618

(58) Field of Search .................................... 313/356, 631, 313/311, 618, 582, 585, 586, 326

(56) References Cited

U.S. PATENT DOCUMENTS

| | | |
|---|---|---|
| 3,487,254 | 12/1969 | Vollmer . |
| 3,697,797 | 10/1972 | Freyheit et al. . |
| 3,908,147 | 9/1975 | Hall et al. . |
| 3,970,887 | 7/1976 | Smith et al. . |
| 4,060,748 | 11/1977 | Bayless . |
| 4,698,546 | 10/1987 | Maitland et al. . |
| 4,808,883 | 2/1989 | Iwaya et al. . |
| 4,890,031 | 12/1989 | Zwier . |
| 4,988,918 | 1/1991 | Mori et al. . |
| 5,438,343 | 8/1995 | Khan et al. . |
| 5,496,199 | 3/1996 | Makishima et al. . |
| 5,514,847 | 5/1996 | Makishima et al. . |
| 5,926,496 | * 7/1999 | Ho et al. ................................. 372/92 |
| 5,990,620 | * 11/1999 | Lepselter ............................... 313/585 |

FOREIGN PATENT DOCUMENTS 63-174239   7/1988   (JP) .

OTHER PUBLICATIONS

A. D. White, "New Hollow Cathode Glow Discharge", *Journal of Applied Physics*, vol. 30, No. 5, May 1959, pp. 711–719.

Schoenbach et al., "Microhollow Cathode Discharges", *Appl. Phys. Lett. 68(1)*, Jan. 1, 1996, pp. 13–15.

* cited by examiner

*Primary Examiner*—Nimeshkumar D. Patel
*Assistant Examiner*—Karabi Guharay
(74) *Attorney, Agent, or Firm*—Greer, Burns & Crain, Ltd

(57) ABSTRACT

A microdischarge device having a gas or vapor contained in a microcavity and in electrical contact with a semiconductor substrate, preferably a silicon wafer. A preferred structure includes successive cathode substrate or film, dielectric, and conductive anode layers with the anode and dielectric layers penetrated by a plurality of microcavities to allow electrical contact between the discharge medium and the substrate cathode layer. A hollow cathode structure includes a microcavity that penetrates the cathode. An optical waveguide network may be used in addition to collect and concentrate emission from groups of individual microcavities. The small aperture of the cavity area, of about 1 to 400 micrometers in diameter, enable the electrons in the discharge to be ballistic under certain conditions and permit the gas pressure to exceed one atmosphere. In addition, the small dimensions permit resonance radiation, such as the 254 nm line of atomic mercury, to be extracted efficiently from the discharge volume. Also, these discharges are able to produce transient molecular species, such as the XeI excimer species, on a continuous basis.

18 Claims, 11 Drawing Sheets

MICRODISCHARGE LAMP AND ARRAY

CROSS REFERENCE TO RELATED APPLICATIONS

This application is a continuation-in-part of application Ser. No. 08/858,235, filed May 19, 1997, now U.S. Pat. No. 6,016,027 and claims priority under 35 U.S.C. §120 from that application.

STATEMENT OF GOVERNMENT INTEREST

This invention was made with support of the U.S. Air Force Office of Scientific Research under grant number F49620-97-1-0261. The government has certain rights in this invention.

FIELD OF THE INVENTION

The present invention concerns microdischarge lamps and arrays. By combining integrated circuit technology and gas discharges, this invention offers miniature discharge devices in silicon that can readily be manufactured as single devices or arrays for lighting, displays, sensors, frequency standards, or for the decomposition of environmentally hazardous gases. More particularly, the present invention is directed to microdischarge lamps and arrays having a cathode formed by a semiconductor substrate, such as a silicon wafer, or a semiconductor film. A microcavity in or extending from the substrate contains a discharge medium such as a gas or vapor. The entire substrate may be a semiconductor, or may include semiconductor regions, or may comprise a semiconductor film on an inexpensive substrate such as glass, to thereby form the cathode for the microcavity. Many uses of the microdischarge lamp, lamps and arrays, including displays and more general lighting applications, as well as remediation and sensing of toxic gases, will be readily apparent to those skilled in the art.

BACKGROUND OF THE INVENTION

Discharge lamps of different forms have been in use for about a century. Today, gas discharge lamps, such as mercury vapor, sodium vapor and metal halide lamps, continue to represent a substantial fraction of the lighting industry. Typically, the lamps are formed from a sealed vessel which holds the vapor or gas, and is electrically excited by a voltage applied between metal electrodes. However, conventional lamps suffer from several drawbacks, one of which is the maximum operating gas (or vapor) pressure. For some lamps such as arc lamps, the pressure is limited by the strength of the vessel material, which must be transparent or translucent to create an effective light source. Others, such as hollow cathode lamps, have a maximum gas pressure at which hollow cathode discharge operation can be achieved. Generally fabricated in metals, hollow cathodes for conventional discharge lamps typically have diameters on the order of millimeters or centimeters and are normally limited to operation at pressures of a few Torr.

One approach to addressing these limitations for high pressure arc lamps is proposed in U.S. Pat. No. 5,438,343 to Khan et al. which contemplates a large number of microcavities, each of which can operate at a higher pressure than a single large cavity. The microcavities are formed by wafer bonding of two micromachined substrates of fused quartz, sapphire, glass or other transparent or translucent material. Cavities in the separate substrates align to form vessels for containing a gas or other "filler" (e.g., metal, metal-halide, etc.) after the substrates are bonded. While a RF "electrodeless" embodiment is disclosed, other embodiments include etched recesses adjacent to the vessels in one or both of the substrates for accommodating separate metal electrodes. After the electrodes are deposited or otherwise placed in the recesses to electrically contact the discharge medium, the separate substrates are bonded together by van der Waal's forces.

Separate plugs are required at the point where the electrode connections enter the vessel wall to maintain the vacuum integrity of the device. The plug material, which may be glass, is deposited over metal electrodes to reinforce the microcavity which is weakened by the recess necessary to accommodate a separate electrode. Together, the reliance on van der Waal's forces to bond separate substrates and the need for reinforcing plugs significantly complicate the production of the device. Another difficulty with the lamp devised by Khan et al. concerns the substrate material itself. Sapphire, fused quartz and other materials used in U.S. Pat. No. 5,438,343 for transparent or translucent substrates are brittle and difficult to process. The operation of the Khan device is also limited to a positive column discharge by the device geometry.

Others have proposed cavities in hollow metal cathodes having diameters as small as approximately 1 mm. As early as 1959, White, "New Hollow Cathode Glow Discharge," *J. Appl. Phys.* 30, 711 (1959), examined hollow cathode devices having typical diameters of 750 $\mu$m formed in a variety of metals, including molybdenum and niobium. More recently, Schoenbach et al., "Microhollow Cathode Discharges," *Appl. Phys. Lett.* 68, 13 (1996), produced and studied hollow cathode lamps having cavities with diameters of approximately 700 $\mu$m machined in molybdenum and insulators made of mica. However, the processes used to produce cavities having diameters of approximately 700 $\mu$m in bulk metals are not conducive to mass production or to the fabrication of arrays of microdischarges. In addition, sputtering of the metal cathode limits device lifetime.

Schoenbach et al. also recognized the benefit of cavities smaller than 700 $\mu$m. Although Schoenbach et al. reported an effective cavity of 75 $\mu$m in molybdenum, this structure consisted of a machined hole having a diameter on the order of 700 $\mu$m forming most of the cathode, and a smaller 75 $\mu$m cathode opening, thus producing a microcavity aperture only at the top of the device. This arrangement would not lend itself to the mass production of inexpensive devices, and it is not clear that the performance characteristics of such a two-section cathode would be similar to a true microcavity cathode having a maximum diameter from below about 500 $\mu$m down to about a single micrometer. Another concern with metal cathode devices is the formation of metal-bearing compounds (including the metal halides) that are a byproduct of the reaction of various metals with some discharge media that are useful, such as the halogens.

These issues have important implications for a variety of microdischarge applications, and their potential as displays and lighting sources, in particular. The leading candidates currently being pursued for high resolution displays are liquid crystals, field emission devices, and plasma panels. Large area displays have largely been the domain of plasma panels which are now available in 42" diagonal displays. However, plasma panels present formidable manufacturing challenges stemming from the materials employed and the approach that has been adopted for producing the display. Discharge gaps, typically 100 to 300 $\mu$m in commercial devices, are defined by the spacing between metal electrodes, one of which is often a wire (see, for example, Kyung Cheol Choi, "Microdischarge in microbridge plasma display with holes in the cathode," *IEEE Electron Dev. Lett.* 19, 186 (1998)). Precisely constructing scores (or thousands) of microdischarge devices so that the discharge gap does not vary significantly among the discharges is a difficult task.

The other display technologies currently under consideration also suffer from several drawbacks. Despite their use in portable and desktop computer displays, for example, liquid crystals are limited in brightness and offer a restricted viewing angle. Field emission devices rely on processing silicon pyramidal structures by VLSI fabrication techniques. These devices produce a weak current when a voltage is applied between the tip of the Si pyramid (or cone) and an electrode (anode). The magnitude of the emission current is sensitive to the gap between the two which, combined with the requirement that the device operate in a vacuum, mandates sophisticated manufacturing processes and has thus far limited the sizes of field emission displays to typically 5–10" (along the diagonal).

Accordingly, it is an object of the present invention to provide an improved microdischarge device that eliminates several limitations associated with the manufacture and performance of conventional lamps and displays.

A further object of the present invention is to provide an improved microdischarge device having at least one microcavity electrically contacted to a one-piece or multilayered substrate which forms a cathode for the microcavity.

Another object of the present invention is to provide an improved microdischarge device including a microcavity in a silicon substrate which contains a conductive medium ("filler"), such as gas or vapor, wherein the filler is electrically contacted by a semiconductor cathode formed in the silicon around the microcavity.

An additional object of the present invention is to provide an improved microdischarge device and array design including a microcavity penetrating a dielectric and a planar metallized (or semiconductor) anode, and extending from a planar semiconductor cathode, where the microcavity contains a conductive filler, such as gas or vapor, and the filler is electrically contacted by the semiconductor cathode.

Still another object of the present invention is to provide an improved microdischarge lamp including a microcavity in a silicon substrate (or silicon film on an insulating substrate such as glass) which contains a conductive filler, the filler being electrically contacted by one or more semiconductor electrodes formed in the silicon, wherein the lamp is operable as a hollow cathode discharge at a pd product (pressure×diameter) exceeding approximately 20 Torr-mm, depending on the selected ratio of the cavity length to the cavity aperture.

Still another object of the present invention is to provide an improved microdischarge device having a thin film, multilayered structure whereby the optical radiation from a single microdischarge or an array of microdischarges can be coupled into a planar optical waveguide.

Still another object of the present invention is to provide improved microdischarge arrays which can be locked in phase for providing optical radiation from an ensemble of emitters having well-defined characteristics.

Still another object of the present invention is to provide an improved array of microdischarges in which the microcavity extends through the substrate and electrodes are fabricated on opposite sides of the substrate, allowing gases or vapors to flow through the microdischarge cavities, in which the gases can be decomposed into a less hazardous form or converted into a more useful species.

SUMMARY OF THE INVENTION

The present invention concerns a microdischarge device having a microcavity enclosing a discharge medium (gas or vapor) excited through electrical contact with a surrounding or planar substrate cathode, such as a silicon wafer. Hollow cathode geometries are achieved by having the microcavity penetrate the semiconductor cathode. The semiconductor electrode may also serve as a planar electrode from which the microcavity or a microchannel extends through a dielectric and planar anode.

Selection of a sufficient aperture to length ratio for the hollow cathode geometry cavity permits the device to be operated as a hollow cathode discharge at pd products exceeding about 20 Torr-mm. If the cathode is chosen to be cylindrical in cross-section, the small diameter offered by this device, on the order of about a single micrometer to about 400 $\mu$m, enables the discharge to be operated at pressures beyond one atmosphere. In addition, the small dimensions permit efficient production in a discharge of resonance radiation, such as the 254 nm line of atomic mercury, because the device size can now be made comparable to or less than the mean distance for the absorption of a resonant photon by a ground state atom. Arrays of microdischarges may be used as lighting sources, flat displays, high definition flat panel television screens, sensors, and in many other devices and applications, including the remediation of toxic gases or vapors.

The planar electrode geometry of the invention is also well suited to the discharge array arrangement. In a preferred embodiment, arrays of micro channels are formed through VLSI fabrication techniques on a planar silicon electrode to produce pulsed or continuous emission from atomic rare gases and transient molecules, such as the rare gas-halide excimer xenon-monoiodide (XeI). The planar geometry includes a dielectric film to form the microcavities, preferably in the form of microchannels, and a conducting film on the dielectric serves as the anode. Microcavity holes or channels are formed through the conducting film and anode layers through standard VLSI fabrication techniques, e.g., photolithography, plasma and wet etching, etc., so that the underlying semiconductor cathode is exposed.

Waveguides formed above the planar arrays provide a preferred additional aspect of the invention to collect and utilize the light produced by the arrays. A grating or other structure may be used to collect light from hundreds or thousands of individual discharges as the light source for an optoelectronic circuit. Arranging the discharges in rows permits selective collection of radiation from the lamps in a row by a single optical waveguide. A failure of any particular device or a few devices in such an array results in little change in overall light production. As an additional advantage, the incoherent light sources of the invention do not require mirrors and are less sensitive to materials degradation over the operational life of the device than coherent laser sources often used optoelectronic applications. Furthermore, arrays of microdischarges may be used to decompose toxic gases. Because of the large specific power loadings that we have observed in microdischarges (up to 1 MW-cm$^{-3}$ for a 20 $\mu$m diameter device), microdischarge arrays can serve to remediate environmentally hazardous gases and vapors or can be used to produce a useful product such as ozone.

BRIEF DESCRIPTION OF THE DRAWINGS

Other features, objects and advantages of the invention will be made apparent by the detailed description with reference to the drawings, of which.

DETAILED DESCRIPTION OF THE INVENTION

Microdischarge devices of the present invention include a semiconductor cathode, and have geometries, materials, and structures that lend themselves to successful integrated circuit manufacturing techniques. Continuous intense visible and/or ultraviolet emissions are obtained from hollow cathode and planar electrode structures of the microdischarge lamp of the invention from rare gas, rare gas/$O_2$ or $I_2$ mixtures, air, $N_2$, transient diatomic molecular species such as the rare gas-halides, including, e.g., the transient molecule xenon iodide, the rare gas-oxides, the rare gas dimers, metal-halides, and molecules having a low vapor pressure such as $Se_2$. That these devices are manufactured by fabrication techniques standard in the VLSI industry permits one to precisely and inexpensively produce arrays for high definition displays, light (visible and UV) sources, and the remediation of hazardous gases and vapors. Furthermore, since these devices are made with well-developed silicon technology, they can be integrated with electronic devices such as FETs and photodiodes, and passive components such as optical waveguides. Artisans will appreciate that the invention may be used to impact diverse areas of technology and permit miniature devices such as miniature frequency standards, environmental sensors, and displays to be constructed.

Figure 1A:
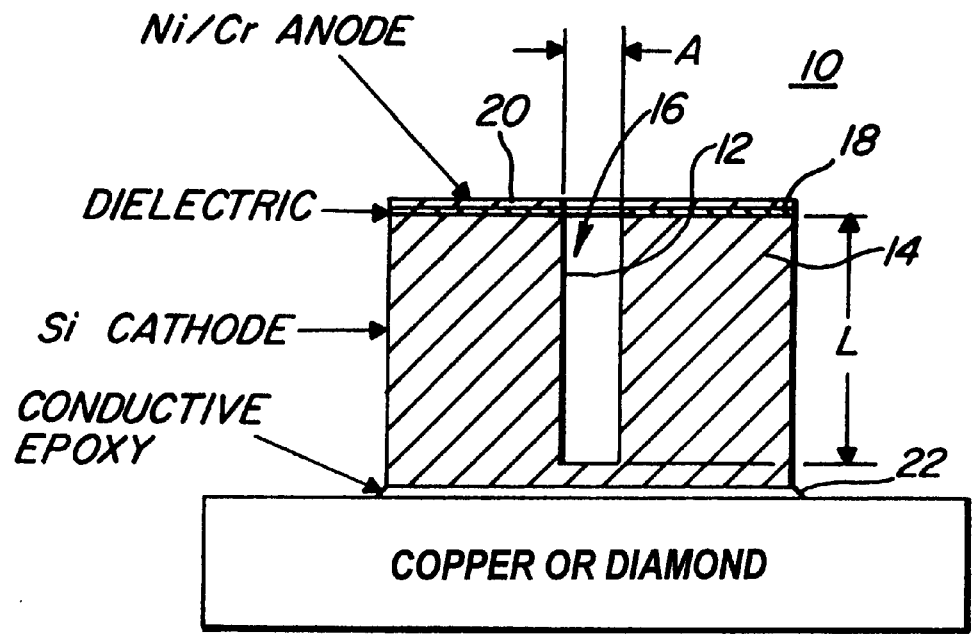
FIG. 1A is a cross section of a microdischarge device which shows the general structure in accordance with the present invention.

A hollow cathode geometry microdischarge lamp 10 according to the present invention is shown in FIG. 1A. The lamp 10 may be formed by a combination of fabrication techniques familiar to the semiconductor industry, which are also similar to fabrication processes used in the field of microelectromechanical systems (MEMS). The lamp 10 has a hollow cathode geometry including a microcavity 12 in a semiconductor substrate 14. Embodiments have been made using a silicon semiconductor, but the similar operational characteristics of Group IV (Ge, diamond), Group Ill-V (GaAs, InP), and Group II-VI (ZnSe) semiconductors indicate that such substrates may also be utilized for lamps constructed according to the present invention. Furthermore, the semiconductor substrate need not be bulk material but could also be a film grown or deposited onto another, less expensive substrate (such as glass).

Hollow Cathode Geometry Structure and Operation

The cavity 12 (cylindrical in the case of FIG. 1) forms the cathode surface, acts as a container for the discharge medium 16, preferably gas or vapor, and defines the discharge volume for the lamp 10. A dielectric 18, such as silicon dioxide, glass or silicon nitride, is deposited on the cathode semiconductor 16, and the device is completed by depositing an anode layer 20, which may be a metal such as Ni/Cr, or another film of semiconductor material, such as polycrystalline silicon. Although only one device is illustrated in FIG. 1A, many devices may be fabricated in a single semiconductor substrate and sealed within a single vacuum-tight enclosure. The enclosure allows for different media such as gases and vapors to be introduced to the discharge region and for the total pressure to be adjusted. Also, different windows can be installed on or as a part of the enclosure for allowing the radiation produced in the discharge to exit the enclosure. A quartz window, for example, efficiently transmits visible and ultraviolet radiation. Another alternative is to fabricate directly in the window (by etching, for example) a Fresnel lens that will serve to focus the radiation as it emerges from the microdischarges. An additional embodiment of the invention is to deposit a film of the conducting material indium tin oxide (ITO) onto the inner surface of the window. After sealing the window onto the microdischarge device, the ITO film will serve as an anode in lieu of the metal or semiconductor layer.

Fabricating from a bulk semiconductor slab (or a thick film) the cathode microcavity which also serves as an electrode for the discharge renders the device capable of operation at elevated pressure (beyond atmospheric) and alleviates the need to produce a discrete cathode. While a cylindrical microcavity 12 is shown in FIG. 1A, the discharge volume can be of arbitrary shape. Discharges having a "trench" geometry, for example, have been successfully operated. The discharge volume is of small dimensions, which are limited only by the capability of the integrated circuit fabrication techniques used to form the cavity 12. Photolithography and plasma or wet etching, ultrasonic machining, and UV laser ablation are examples of suitable fabrication techniques that are capable of producing microcavity apertures. In the case of the illustrated cylinder, diameters ranging from less than a micrometer to about 400 micrometers are easily fabricated. Standard photolithography currently permits an aperture of about 0.3 $\mu$m, and e-beam lithography allows one to produce even smaller apertures.

The ratio of the length L to the aperture A of the microcavity 12 may be selected to permit operation of the discharge as either a positive column or hollow cathode discharge. If the length is several times the aperture, the discharge can operate in the hollow cathode or positive column modes, depending on the gas pressure within the cavity 12. Operation as a hollow cathode produces high energy electrons in the discharge which, in turn, allow access to higher energy states of the gaseous atoms or molecules in the discharge. Also, by decreasing the discharge diameter, the discharge can be operated at higher pressures than conventional discharges.

It is also important to note that the dimensions of the cavity 12 can, for a wide range in gas pressure, be made less than the mean free path for a collision of an electron with another particle. Since the mean free path for a collision between an electron and a gas atom or molecule is given by:

$$L \equiv \frac{1}{\sigma N}$$

where N is the number density of the discharge gas or vapor and $\sigma$ is the collision cross section, raising the gas pressure in a discharge lowers the mean free path. In the microdischarge lamp 10, the dimensions may be chosen to be small enough that the gas pressure can be raised above the value accessible to a conventional discharge, and still operate in a hollow cathode mode. This property has several implications for the characteristics of microdischarges, one of which is that the electrons in the discharge will be ballistic, having an energy roughly equal to a voltage applied to the discharge between cathode 14 and anode 20. Energy may be supplied to the cathode 14 through a conductive epoxy 22 via a metal substrate 24, such as copper, or other material, such as diamond, or a refrigerator having a high capacity for heat removal. Separate contact is made to the anode layer 20.

The cathode material can have a large resistivity and still form a stable discharge. Conventional discharges use metals for the cathode and anode. Presumably, use of a more resistive semiconductor substrate with a hollow cathode geometry would cause the voltage to vary along the length of the cathode. However, the present invention demonstrates the ability to form stable discharges using such materials. The preferred semiconducting material, silicon, also compares favorably in several respects with metals used in conventional discharge devices. Silicon has a high resistance to sputtering, can be obtained in nearly arbitrary purity, has a thermal conductivity larger than that of many metals (such as Fe, Ni, or Pd), and has a melting point of 1415° C. It is also inexpensive and is not environmentally hazardous.

A semiconducting substrate also permits the direct integration of discharge devices with electronic and electro-optical devices. For example, the control and driving circuitry for the discharge can be integrated onto the same substrate as that in which the discharge is fabricated. In addition, ballast resistors can be formed by tailoring the resistivity of the interconnects in an addressable array or by adjusting the substrate resistivity and the discharge-to-discharge spacing for non-addressable arrays.

These combined characteristics allow the lamp 10 to produce light in a manner that is difficult or impossible with a conventional sized (macro) discharge. Additionally, the small aperture and adjustable length of the microdischarge allow for the efficient extraction of resonance radiation from the discharge. Such emission tends to be intense and of commercial and scientific value. One resonance line of interest is the 253.7 nm transition of atomic mercury, which is effectively used in germicidal applications, polymer curing, and other processes requiring deep-UV photons. Because photons produced from resonance emission are quickly re-absorbed, conventional mercury resonance lamps are typically constructed from heavy wall capillary tubing, and operate at a low partial pressure of mercury to allow the resonance photon to escape the discharge. On the other hand, the present microdischarge lamp 10, having a microcavity aperture of about one to 400 micrometers and an adjustable length, can be designed so as to allow most resonance photons to escape the discharge cavity 12. That is, the discharge dimensions can be made to be approximately equal to or less than the mean distance for the absorption of a resonance photon in a discharge at a given pressure.

The microdischarge lamp 10 also permits operation at gas pressures exceeding one atmosphere which allows one to produce transient molecular species, such as XeI and $Xe_2$, that require pressures beyond 100 Torr for efficient formation and, therefore, are not available in conventional glow discharge lamps. XeI produces emission in the UV spectral region at 254 nm, which virtually coincides with the resonance emission of mercury. Consequently, XeI may be used as a substitute for mercury in the lamp of the present invention to avoid the environmental concerns associated with mercury.

Fabrication of the Hollow Cathode Geometry Discharge Lamp 10

Experimental microdischarge lamps according to the present invention have been formed by depositing a metal layer (roughly 0.4 $\mu$m in thickness) on a portion of a glass microscope slide (soda lime glass). Thicker anode films (>10 $\mu$m of Ni, for example) have also been deposited by electroplating. Metals used thus far in the production of the experimental lamps include Cr, Cr followed by Ni, Cr followed by Ni followed by electroplated Ni, and Cr followed by Al. The metal was then patterned into a circular shape roughly 1 cm in diameter by masking with photoresist and etching in a wet etch. Afterwards, the glass was epoxied to a 5 mm cube of single crystal high purity silicon or metallurgical grade silicon. Each experimental lamp was then completed by ultrasonically machining a hole of the desired dimensions through the metal anode film, glass dielectric, and into the Si base.

Mass production of the microdischarge lamps could be accomplished in a variety of ways. The first contemplated method employs contacts to both the front and back sides of the substrate. In the second contemplated method, only contact to the top surface is required and the lamps can be made to be electrically isolated. A third contemplated method includes provision for a gas reserve to prolong device lifetime.

The first method begins with a conventional single crystal silicon wafer (which serves as a substrate) and is accomplished through the following steps:

1) Grow or deposit a silicon dioxide, glass, or silicon nitride layer on the substrate to serve as the dielectric insulating layer.
2) Grow or deposit a polysilicon layer or metal film to serve as the anode.
3) Pattern and etch the polysilicon to form the desired anode shape.
4) Etch through any backside oxide that may be present to allow contact to the substrate.
5) Mask the sample with photoresist so that the polysilicon anode is exposed where the discharge cavity is desired.
6) Etch the polysilicon and silicon dioxide layers.
7) Etch the single crystal silicon substrate by reactive ion etching to form the microcavity cathode.

A preliminary step for the second method is the production of a lightly doped silicon substrate. For simplicity, it is assumed that the substrate is doped to be p-type. However, the method is equally applicable with n-type substrates by substituting p-type diffuisions for the n-type diffusions listed below. The second method consists of the following steps, assuming that the starting substrate is lightly doped p-type:

1) By diffusion, form an n-type layer on the top surface of the substrate.

Prior to diffusion, masking of the surface permits one to diffuse into only certain areas.

2) Grow or deposit a silicon dioxide layer to serve as the dielectric insulating layer.
3) Grow or deposit a polysilicon layer (or metal film) to serve as the anode layer.
4) Pattern and etch the polysilicon film to form the desired anode shape.
5) Etch through any backside oxide that may be present to allow contact to the substrate, if such contact is desired.
6) Deposit a second layer of dielectric (such as silicon dioxide or silicon nitride) to protect the anode and to prevent discharge formation in a region other than the microcavity.
7) Mask the sample with photoresist to define the discharge.
8) Etch through both dielectric layers and the polysilicon layer to form an opening for the desired microcavity aperture.
9) Reactive ion etch the cathode into the substrate.
10) Diffuse n-type dopants into the cathode.
11) Open contacts to the polysilicon layers, the n-type layer, and the p-type substrate.
12) Perform any metallizations required to make contacts off the chip.

In the second method, device isolation can be achieved by reverse biasing, same biasing, or any bias setting blocking current flow through the p-n junctions.

Figure 1B:
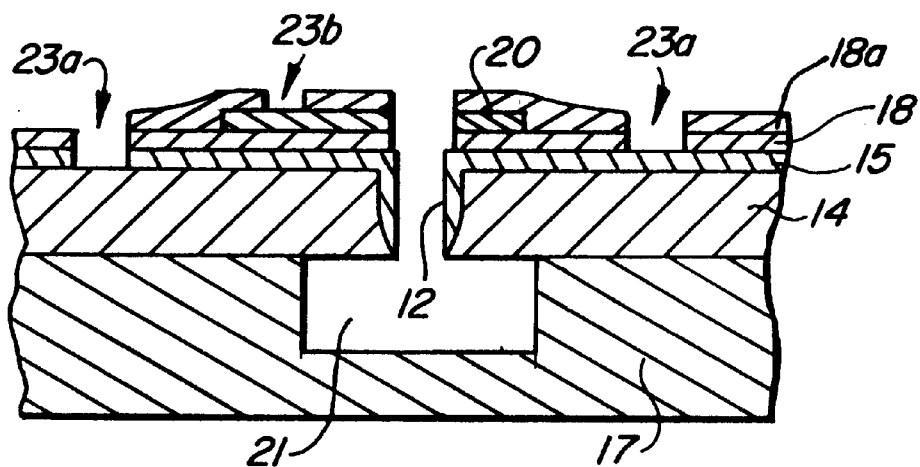
FIG. 1B is a cross section which shows a microdischarge lamp of the present invention including a separate discharge gas reservoir.

Production of a device with a gas reservoir may also be achieved to prolong device life. Such a device is shown in FIG. 1B, where elements common to FIG. 1A use like reference numbers. The substrate 14 is preferably a p-type silicon substrate, including an n-type diffusion region 15 surrounding the cavity 12. An additional n-type silicon substrate 17 forms the reservoir 21 below the cavity 12. Contact holes 23a for the cathode and contact holes 23b for the anode penetrate the dielectric layers 18 which isolate the cathode 15 and anode 20. Such a device may be produced according to the following steps:

1) Diffuse an n-type layer 15 on the top surface of the substrate 14. This diffusion may be masked so that only certain areas are diffused.
2) Grow or deposit a silicon dioxide layer 18 to serve as the dielectric insulating layer.
3) Grow or deposit polysilicon or a metal film to serve as the anode 20.
4) Pattern and etch the polysilicon to form the desired anode shape.
5) If needed, etch through any backside oxide that may be present.
6) Deposit a second layer of dielectric 18a (silicon dioxide or silicon nitride) to protect the anode and to prevent discharge formation in any region other than the microcavity.
7) Mask the sample with photoresist to define the discharge microcavity.
8) Etch the polysilicon and dielectric layers.
9) Etch through the substrate using reactive ion etching to form the cavity 12.
10) Diffuse n-type dopants into the cathode.
11) Etch a series of channels or pits in a second substrate, doped n-type.
12) Bond the substrates together such that the pits or channels in the second substrate are aligned with the discharges. Substrate bonding can be accomplished by fusion bonding, eutectic bonding with a metal such as Al, or bonding to thin silicon dioxide layers on the surfaces to be joined by anodic bonding.
13) Open contacts 23a to the polysilicon layers, n-type layer, and the p-type substrate, as well as to the backside of the bonded substrate.
14) Perform any metallizations required to make contacts off chip.

Using the above procedure allows for the direct integration of a gas reservoir 21 into the discharge device. This design may substantially increase the device lifetime if the device lifetime is limited by gas depletion.

Film Devices

Figure 2:
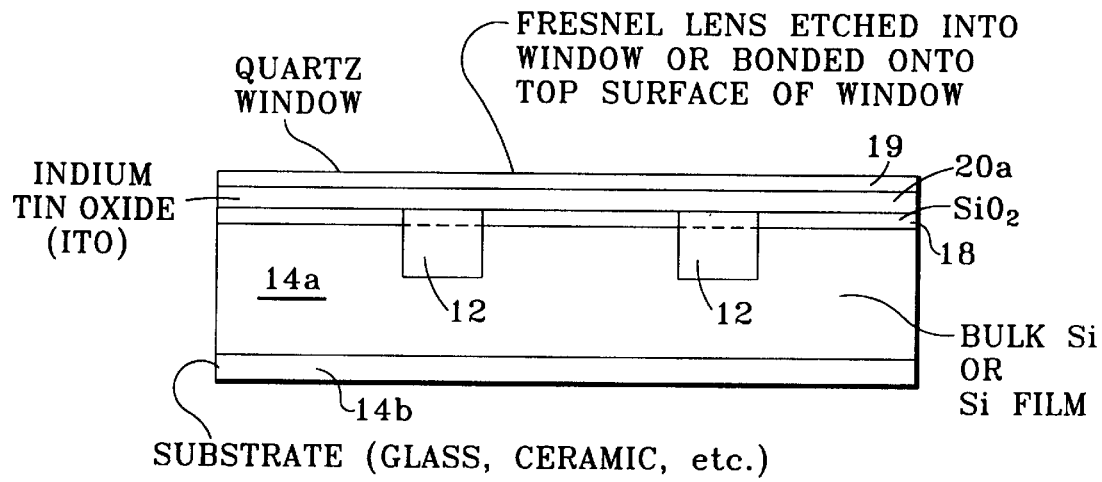
FIG. 2 is a cross section of two microdischarge devices in an array.

FIG. 2 illustrates several modifications to the designs of FIGS. 1A and 1B, of which any or all could be incorporated into any number of useful devices. Rather than Si wafers or slabs as the substrate material, the FIG. 2 embodiments use a thick Si film 14a deposited onto an inexpensive substrate 14b such as glass or a ceramic material. A crystalline Si film is not believed necessary, and polycrystalline material should suffice. The microdischarge cathode 12 can be fabricated into the film 14a as described earlier. Furthermore, rather than a semiconductor (such as doped polycrystalline Si) or metal anode, a film of indium tin oxide 20a (ITO) deposited onto a window 19 (preferably of quartz or glass but some plastics will also-suffice) can serve as the anode for a number of microdischarges 12 in an array, two elements of which are shown in FIG. 2. ITO 20a is transparent in the visible portion of the spectrum and yet is electrically conductive. Once the ITO 20a is deposited onto the window 19, the window/ITO subassembly can be bonded to the $SiO_2$/Si cathode/substrate assembly to form a sealed device. If sealing is conducted in an atmosphere of the gas or vapor desired as the discharge medium (such as a rare gas or mixture of rare gases), then the finished unit will have the proper gas and pressure in each microdischarge cavity 12 when assembly is completed. As a further variation, a Fresnel lens can be etched directly into the quartz or glass window. The lens will serve to focus the optical radiation produced by the microdischarges 12.

Another variation on the device will involve leaving the dielectric separating the discharge anode 20a and cathode as a continuous film. As illustrated by the dashed lines of FIG. 2, the dielectric 18 (preferably SiO$_2$) in this situation would cover the entire microcavity 12. Fabricating such a structure would require modification of the steps outlined earlier, but can be done in several ways. One would be to deposit or grow an SiO$_2$ film onto the Si film of FIG. 2 (or bulk Si substrate of FIGS. 1A and 1B) and etch (or drill by laser micromachining) the microcavity from the back side of the device; machining would be terminated when the dielectric film 18 is reached. Another approach is to grow or deposit the dielectric onto the ITO film 20a of FIG. 2 which, in turn, is deposited onto the window 19. Subsequently, the dielectric/anode (ITO)/window assembly is bonded to the substrate/Si assembly.

Regardless of the fabrication approach adopted, the purpose for allowing a dielectric film to electrically isolate the anode and cathode is to generate capacitive discharges in the microcavity. Capacitive discharges can be operated on an AC basis which is more than adequate for applications such as displays and lighting. Also, isolating the gaseous medium in an enclosure formed by the cathode and dielectric should better preserve the purity of the initial gas fill and minimize contamination of the discharge by impurities generated by electrode sputtering and other mechanisms.

"Flow Through" Structure

Figure 3:
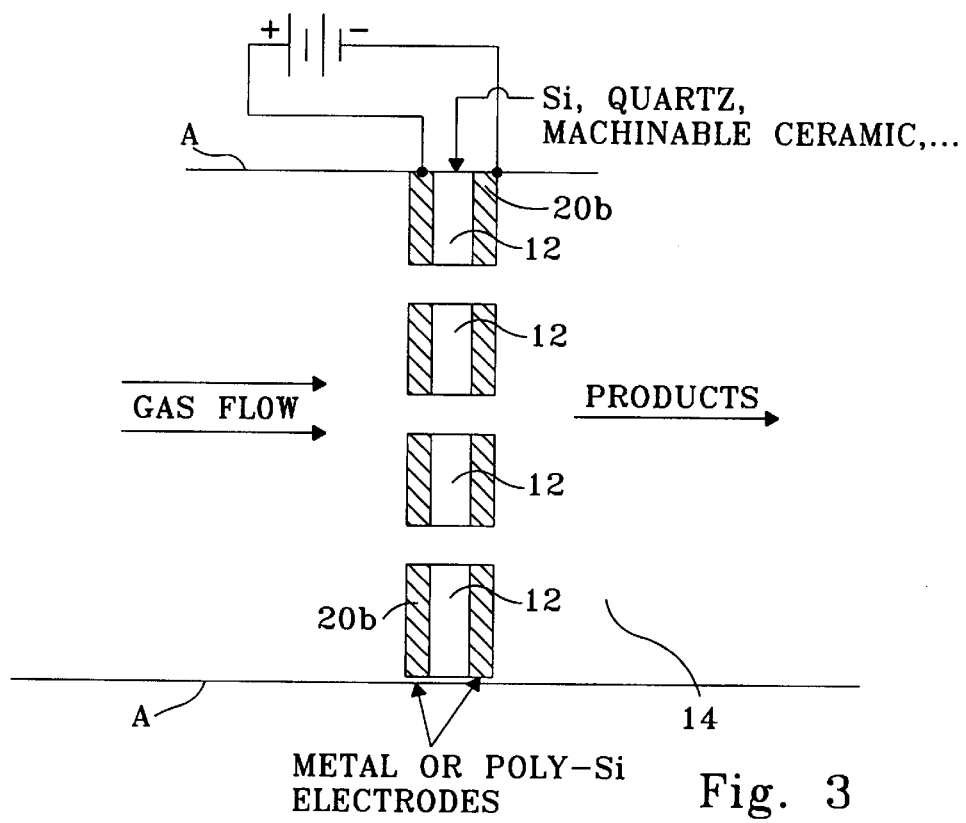
FIG. 3 is a side view of an array of microdischarges in a hollow tube with the microcavities extending entirely through the substrate with electrical contacts on each side.

Another embodiment of the invention is illustrated in FIG. 3. In this configuration, the microcavity 12 extends completely through the substrate 14 which can be constructed from a semiconductor such as Si or an insulating material such as glass or machinable ceramic. The substrate is situated in a tube A which directs the flow of gas or vapor completely through the discharges 12. Discharge electrodes 20b (metal or polycrystalline Si, for example) are formed on either side of the substrate 14 and although FIG. 3 illustrates the electrodes as covering the entire surface of the substrate, electrodes can also be patterned on both sides.

Our studies of cylindrical microdischarges having diameters as low as 20 $\mu$m show that specific power loadings of the medium as high as 1 MW-cm$^{-3}$ can be sustained. This degree of power deposition into a plasma on a continuous basis is unprecedented and suggests that an array of devices will be effective in decomposing hazardous gases. Specifically, toxic or environmentally hazardous gases, possibly untrained in a "carrier" gas such as argon, are flowed through an array of discharges as shown in FIG. 3. In the discharges, the source molecules are decomposed by electron impact processes. The discharge may directly produce benign products from the original molecules or may generate an intermediate species that reacts with the carrier gas to produce the final desired products. Another application of the configuration of FIG. 3 is to produce a desired species from a non-toxic source gas. Microdischarge arrays, for example, are an effective means for converting oxygen (O$_2$) into ozone (O$_3$) which is useful for a variety of purposes. It should also be noted that it might be beneficial to effect the decomposition or transformation of the source gas in stages which would involve two or more substrate/electrode assemblies (such as the one illustrated in FIG. 3) in tandem.

Performance of Prototype Hollow Cathode Geometry Lamps

Prototype lamps having cylindrical microdischarge cavities from 200 to 400 $\mu$m in diameter (aperture) and 0.5–5 mm in depth, with discharge gases of neon or nitrogen, have been operated at room temperature with specific power loadings beyond 10 kW/cm$^3$. The resultant discharges are azimuthally uniform. Stable operation at N$_2$ and Ne pressures exceeding 1 atm and 600 Torr, respectively, has been demonstrated for 400 $\mu$m diameter devices. Spectroscopic measurements on neon discharges having a 400 $\mu$m diameter cylindrical microcavity demonstrate that the device behaves as a hollow cathode discharge for pressures >50 Torr. As shown by emission from Ne and Ne$^+$ states, as well as N$_2$ (C→B) fluorescence (316–492 nm), the microdischarge lamps of the present invention are intense sources of ultraviolet and visible radiation, suitable for fabrication as addressable arrays.

Figure 4:
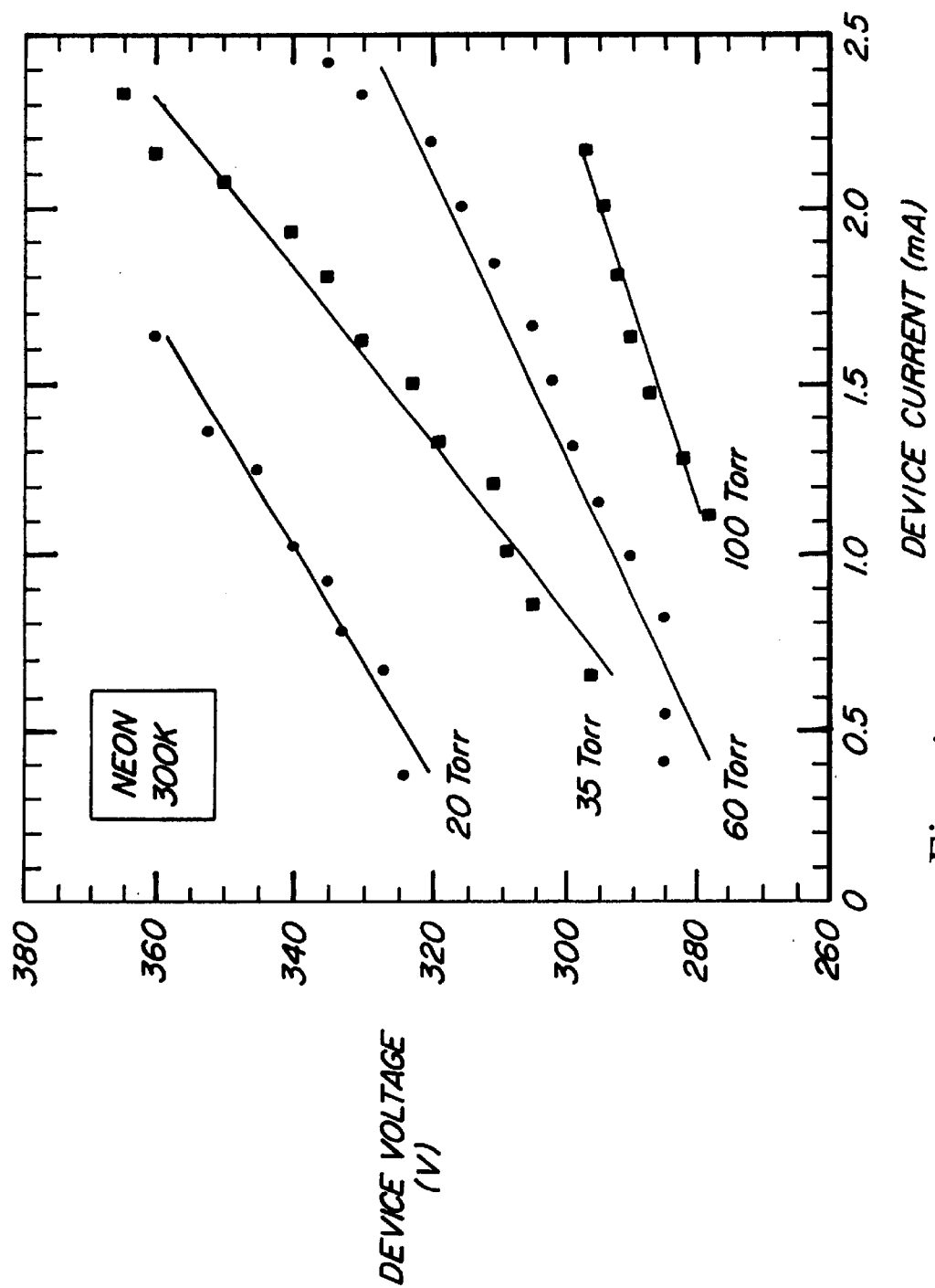
FIG. 4 is a plot of the I–V characteristics for a 400 $\mu$m diameter, 1.75 mm long cylindrical aperture microdischarge lamp according to the present invention with Ne gas at pressures ranging from 20 to 100 Torr.

Referring now to FIG. 4, shown are the current-voltage characteristics of a 400 $\mu$m cylindrical aperture microdischarge having a cavity length of 1.75 mm and neon gas at pressures ranging from 20 to 100 Torr. Similar results (not shown in FIG. 4) were achieved for higher pressures and currents of up to 4 mA. Over the entire current and pressure range, the I-V characteristics demonstrated a positive differential resistivity, while the specific power loading of the discharge ranges from approximately 1 to 4 kW/cm$^3$ on a continuous (CW) basis. At pressures above 200 Torr and currents above 4 mA, the power loading exceeded 10 kW/cm$^3$ for a 200 $\mu$m diameter microdischarge lamp. As a check for power loss through the bulk of the lamp, an electrical probe was inserted into the cylindrical cavity and the resistance between the probe and rear contact was measured to be less than 150 $\Omega$. Thus, for currents typical of discharge operation, power loss in the silicon substrate of the device is negligible. Stable glow discharges in Ne are reliably generated in the 400 $\mu$m device at pressures exceeding 500 Torr. All the discharges are azimuthally uniform with peak intensity produced on axis.

Figure 5:
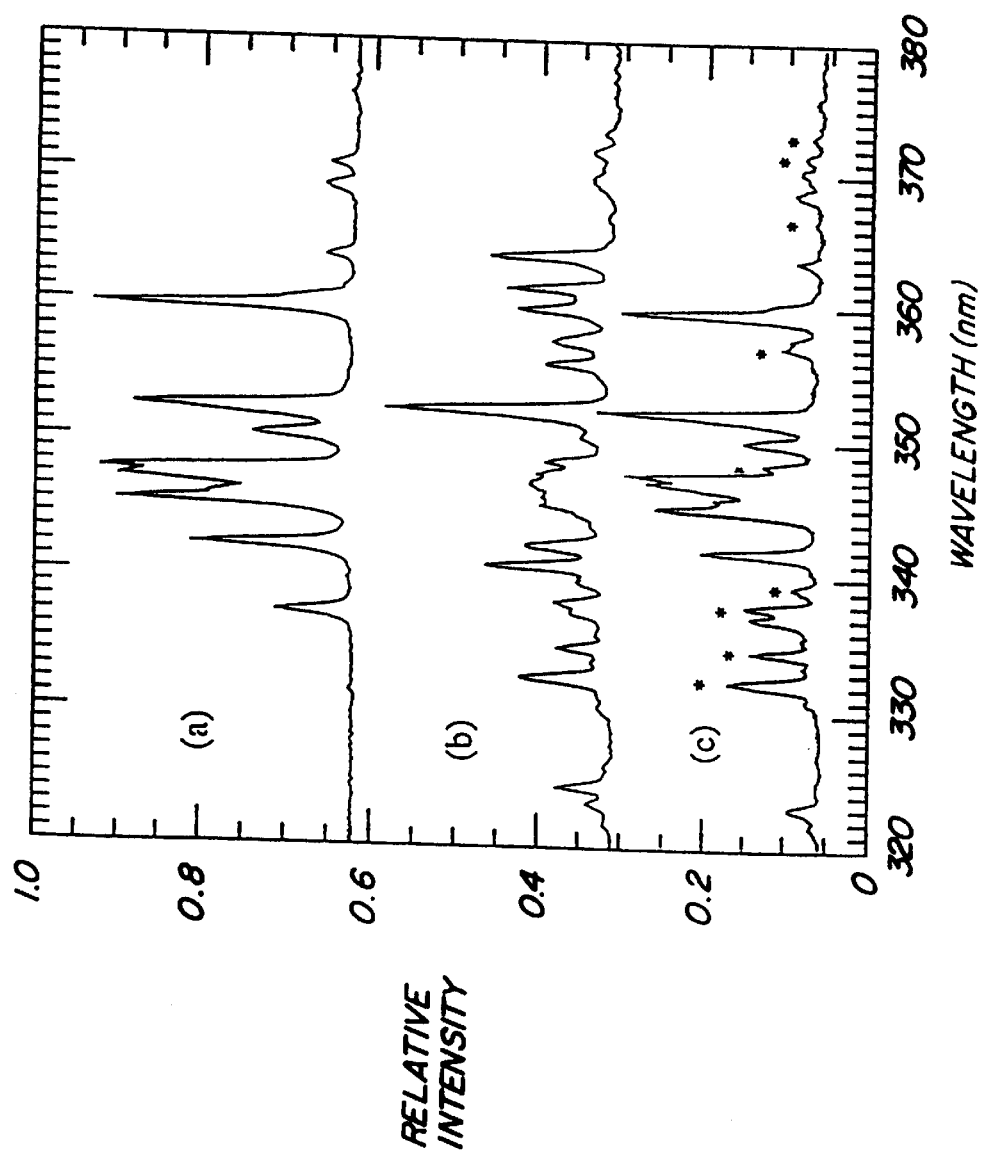
FIG. 5 is a plot that compares the emission spectrum in the near UV region for a 400 $\mu$m diameter, 3.5 mm cylindrical aperture microdischarge lamp (spectrum (c)) with Ne gas according to the present invention, with those produced by a conventional spectrophotometer hollow cathode lamp (b) and a conventional positive column lamp (a)

The operation of the microdischarge lamp may also be characterized by its emission spectra, which serve as a sensitive diagnostic of the transition from hollow cathode operation to a normal glow. Though greater than 90% of the total emission produced by a neon discharge lies in the red, the UV spectral region includes transitions that are most sensitive to the electron energy distribution function and are, therefore, the best evidence for hollow cathode operation. FIG. 5 presents a comparison of the UV spectra in the 320–380 nm region generated by a) a commercial positive column Ne discharge pen lamp; b) a conventional approximately 2.5 mm diameter Ne hollow cathode discharge spectrophotometer lamp; and c) a continuous wave microdischarge lamp constructed in accordance with the present invention (diameter=400 $\mu$m, L=3.5 mm, 235 V, 3 mA) operating at 55 Torr (pd=22 Torr-mm). The spectra show that the microdischarge lamp of the present invention behaved as a hollow cathode discharge for a pressure-diameter product exceeding 20 Torr-mm, which is approximately an order of magnitude larger than those for which hollow cathode operation is achieved with conventional devices.

Figure 6:
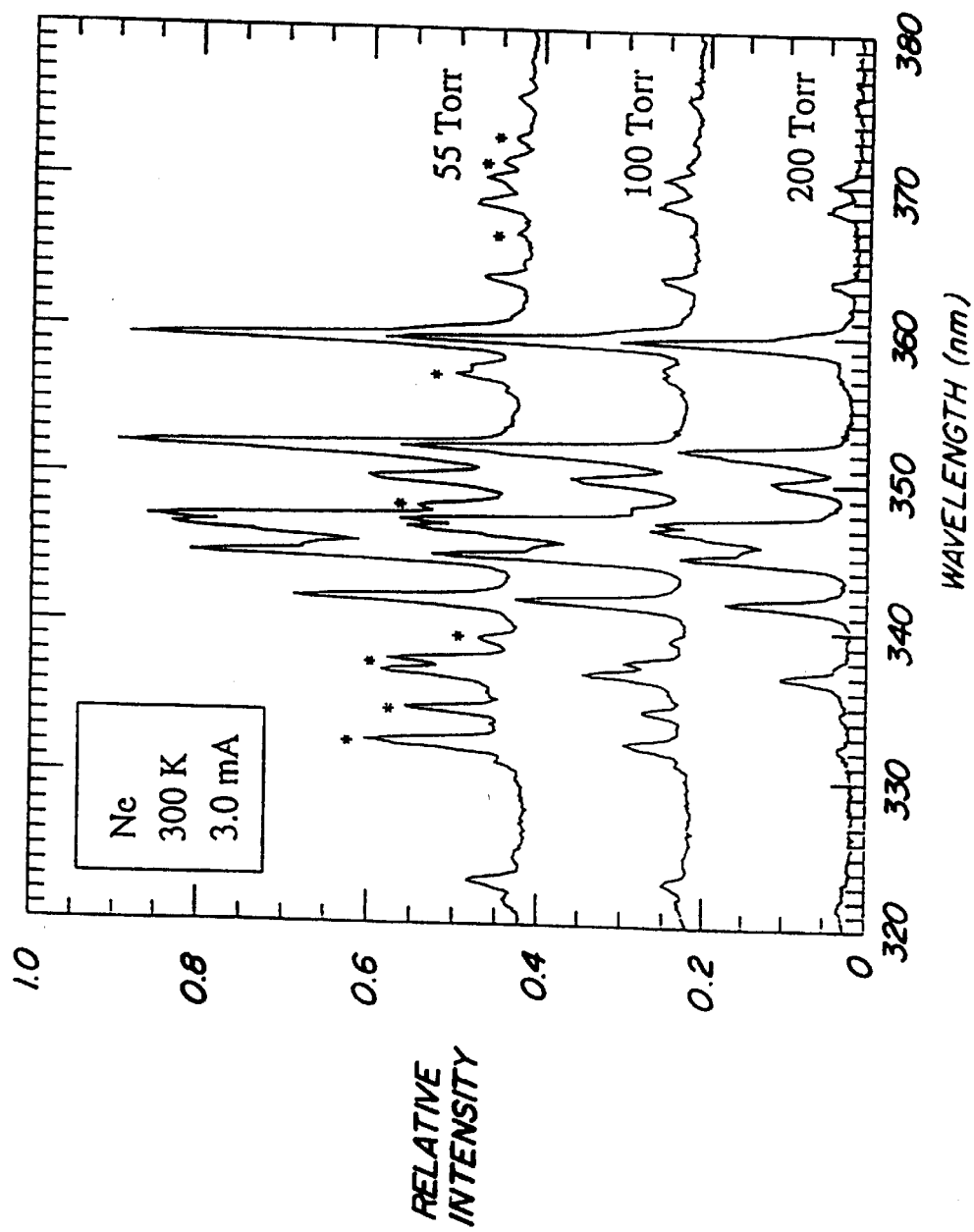
FIG. 6 is a plot showing variations in the spectra of a microdischarge lamp of the invention characterized in FIG. 5 for several Ne gas pressures.

Specifically, all of the lines in the microdischarge spectrum arise from Ne and Ne$^+$, but the latter are present only in the conventional hollow cathode and microdischarge spectra of FIG. 5. The strongest Ne$^+$ lines (334.55 and 332.38 nm) result from transitions originating from $^2$P$^0$ and $^2$F$^0$ states of the ion, respectively, which lie approximately 30 eV above the Ne (2p$^6$) ground state. In FIG. 6, note that the Ne$^+$lines (those indicated with an asterisk) gradually weaken with increasing gas pressure. At 200 Torr, the spectrum is virtually indistinguishable from the conventional positive column discharge characterized in plot a) of FIG. 5.

Stable operation of a microdischarge lamp according to the present invention has also been realized for pure N$_2$ gas at pressures exceeding 1 atm. Discharges in N$_2$ and atmospheric pressure air produce strong N$_2$ (C→B) emission in the UV and visible (316–492 nm). Atomic Si emission lines in the 240–300 nm region are extremely weak or undetectable in rare gas microdischarges, an expected result given the low sputtering rate for Si by rare gas ions. However, in the $N_2$ microdischarge of the present invention, several strong Cr and Ni transitions between 280 and 311 nm have been observed, the most intense of which lie in the 308–311 nm spectral interval and are attributable to Ni.

Separate tests were conducted in which the dielectric comprised an approximately 1.1 micrometer thick $SiO_2$ film, which was grown on a standard 10 cm diameter, 0.5 mm thick n-type integrated circuit grade silicon wafer having a resistivity of approximately 5 $\Omega$-cm. Stable discharges according to the present invention, limited in length by the wafer thickness, were generated. This demonstrates that batch processing according to the above-listed and other similar methods for commercial fabrication of lamps, sensors, displays, etc., according to the present invention is feasible.

Exemplary Devices Incorporating the Present Microdischarge Device

Many applications of the present invention will be apparent to skilled artisans. The ability to integrate the microdischarges with other IC devices suggests that a family of devices, such as microdischarge lamp optical sources, detectors, sensors, and associated electronic devices, may be incorporated onto a single integrated circuit. Two-dimensional (2-D) addressable and non-addressable arrays, and the integration of discharge devices with electronics, are considered here as examples of applications for the present microdischarge device.

Figure 7:
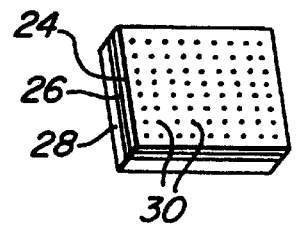
FIG. 7 shows the basic configuration of a two-dimensional, non-addressable array constructed in accordance with the present invention.

A 2-D, non-addressable array can be made by increasing the size of the anode and micromachining multiple identical holes into the same cathode. This is shown generally in FIG. 7, where a large single anode 24, dielectric 26, and substrate 28 have been micromachined with an array of cavities 30. The substrate 28 is preferably silicon, the dielectric 26 is preferably silicon dioxide, and the anode is preferably another thin layer of silicon, though a thin metal layer is also acceptable. The appropriate spacing between adjacent microdischarges will depend on the resistivity of the semiconductor film or wafer in which the cathodes are fabricated but will typically be less than 1 mm. If the inter-discharge spacing is chosen to be less than the coherence length for the atomic or molecular emission of interest, the radiation from the discharges can be "phase-locked," resulting in the array acting as a single large emitter having the approximate dimensions of the array.

Figure 8:
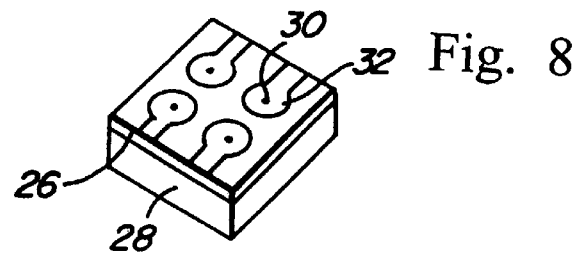
FIG. 8 shows the basic configuration of a small two-dimensional, addressable array constructed in accordance with the present invention.

FIG. 8 shows the general structure of a 2-D addressable array, where the anode layer is patterned such that the separate anodes 32 are formed so that the separate discharge cavities are not electrically connected. In practice, this may require additional layers on top of the anode layer to prevent discharging at undesired locations. For small scale arrays, the individual array elements can be addressed by direct addressing to the anode.

Figure 9:
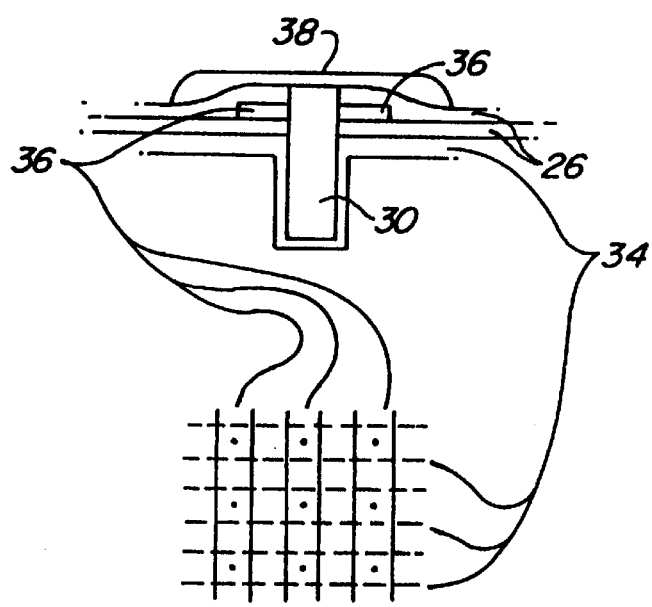
FIG. 9 shows the basic configuration of a crossbar-addressed, two-dimensional array constructed in accordance with the present invention.

For larger scale arrays, a cross-bar addressing scheme may be used to electrically isolate the individual devices and produce an addressable array. As seen in FIG. 9, a cross-bar scheme can be implemented by forming cathode rows 34 with n-diffusion regions in a silicon substrate, and columns 36 with polysilicon anodes. As shown in FIG. 9, separately addressable arrays also require that individual cavities 30, or groups of cavities forming a single pixel, be sealed by a cap 38 of light transmissive material, such as glass, or by the FIG. 2 window/ITO subassembly. Whenever multiple cavity outputs are to be combined, such as in a non-addressable array, the cap 38 may allow a small volume above the cavities to be common to separate cavities. A cap 38 that covers an individual device or groups of devices can be made by bonding or otherwise attaching the glass cover (or quartz or other transmissive material) to the topside of the finished substrate.

Integration of electronics with the discharge can be accomplished by providing isolation junctions that are able to withstand the voltage applied to the discharge. In this way, the region of the substrate in the vicinity of each discharge can be electrically isolated from the electronics. Additionally, passivation layers are necessary to cover any part of the circuitry exposed to the gas or the discharge so as to prevent physical and electrical damage to or interference with the underlying circuitry. The integration of transistor circuitry into the substrate around a non-addressable array allows the array stability to be optimized by controlling the current delivered to each device. The integration of circuitry into the substrate around an addressable array also provides storage capability in the sense that only a single enabling signal is necessary to toggle a pixel (single microdischarge) on or off.

Figure 10:
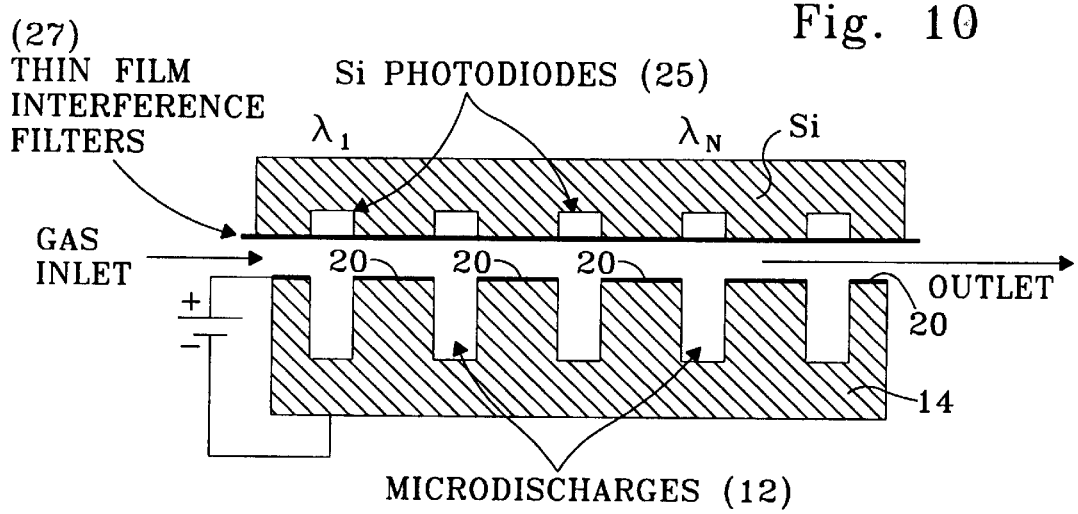
FIG. 10 is a schematic of a multi-microdischarge sensor for atmospheric contaminants in which microdischarges are integrated with Si photodetectors.

Another device which exemplifies the versatility of the present invention is shown schematically in FIG. 10. Since microdischarges are capable of operating continuously at atmospheric pressure, an array of microdischarges 12 are combined with Si photodiodes 25 to create a device made solely of Si which is suitable for detecting contaminants in the atmosphere. Air enters the device from one side (left side in FIG. 10) and some fraction thereof is excited by each of the discharges 12. If pollutants, for example, are present in the gaseous sample, atomic or molecular emissions lines characteristic of that particular pollutant will be produced in the discharge. Across the inlet from each discharge is situated a photodiode 25 and a thin film interference (bandpass) filter 27, the latter of which is designed to pass a particular emission line. Therefore, each discharge/bandpass filter/Si photodiode is designed to detect a specific pollutant or atmospheric constituent (such as water vapor). The electrical signal from each photodiode 25 is a measure of the relative concentration of a particular species. This device is well-suited for monitoring the temporal history of atmospheric pollutants at a fixed location (traffic intersection, for example, or in the tailpipe of an automobile) or, attached to a weather balloon or aircraft, is capable of profiling pollutants or atmospheric constituents as a function of altitude. Many other similar uses will be apparent to those skilled in the art.

Another application for microdischarges is as an on-chip frequency reference. Optical telecommunications systems frequently require a reference frequency to which the system is calibrated. Integrating microdischarges into silicon allows for the discharge to serve as an optogalvanic or absorption frequency standard. The former, for example, would involve directing a small fraction of the beam from a semiconductor laser or lasers into the microdischarge. The gas filler is chosen so as to have an atomic or molecular line in the spectral region of interest. When the laser is tuned onto the transition, a transient voltage change appears across the discharge which can be used to "lock" the laser onto the atomic or molecular transition frequency. This phenomenon is well-known but the microdischarge allows for the frequency standard to now be integrated onto the same chip as many of the other components of an optoelectronic circuit.

Planar Electrode and Arrays

Figure 11:
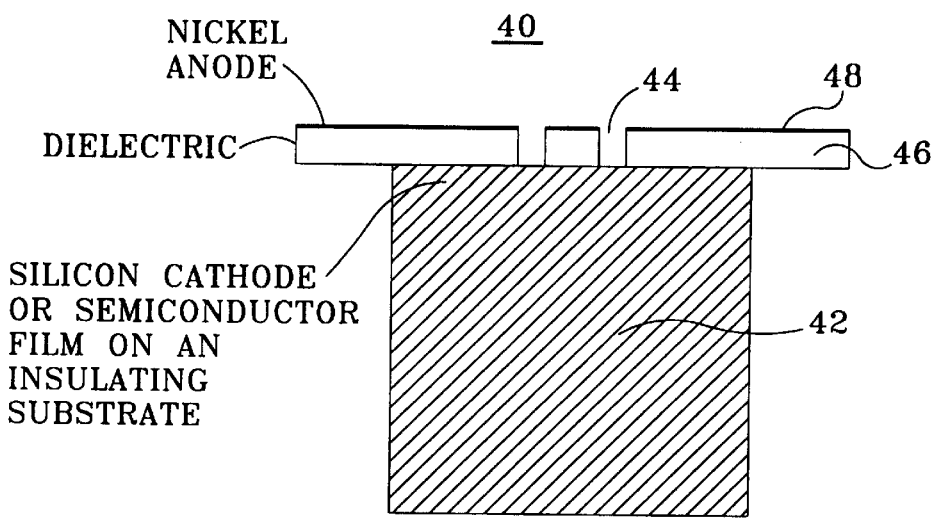
FIG. 11 shows a cross section of a planar electrode microdischarge of the present invention.

A planar electrode discharge lamp 40 of the invention is illustrated in FIG. 11. Operation is similar to that of the hollow cathode geometry lamp 10 in that a semiconductor substrate 42 (bulk or film) acts as the device cathode. The planar arrangement is especially suited toward array devices as it is simpler to fabricate. Most of the characteristics of the hollow cathode device apply to the planar configuration as well, such as the ability to operate at gas pressures up to and beyond one atmosphere. A microcavity 44, taking the form of a cylindrical hole or other preferred cross-sectional shape, penetrates a dielectric layer 46 and a planar conductive anode 48. The planar cathode 42 and anode 48 excite the discharge gas or vapor medium within the microcavity 44.

Figure 12A:
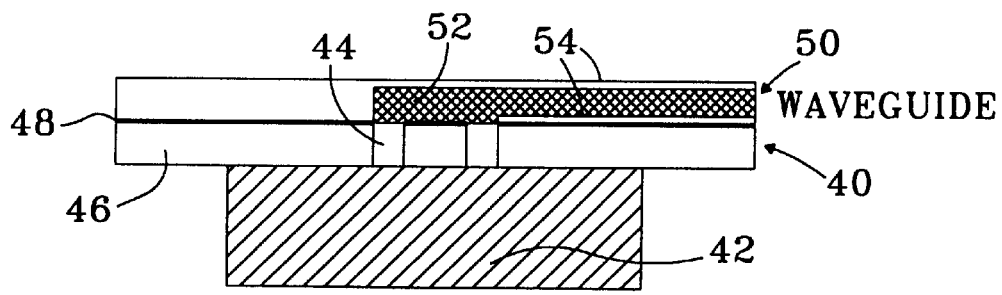
FIG. 12a shows a cross section (side view) of two planar electrode discharges of the present invention coupled to an optical waveguide.

Light from the planar electrode 40 may be collected by an optical waveguide 50, as seen in FIG. 12a. Light from multiple discharge microcavities 44 is collected by a waveguide core 52 and propagates through the core, confined by waveguide cladding 54. Thus, emissions from discharges may be coupled by a grating (not shown but can be etched into the top of 54) or other structure to effectively combine the light from hundreds or thousands of individual discharges for use in optoelectronic circuits or systems.

Figure 12B:
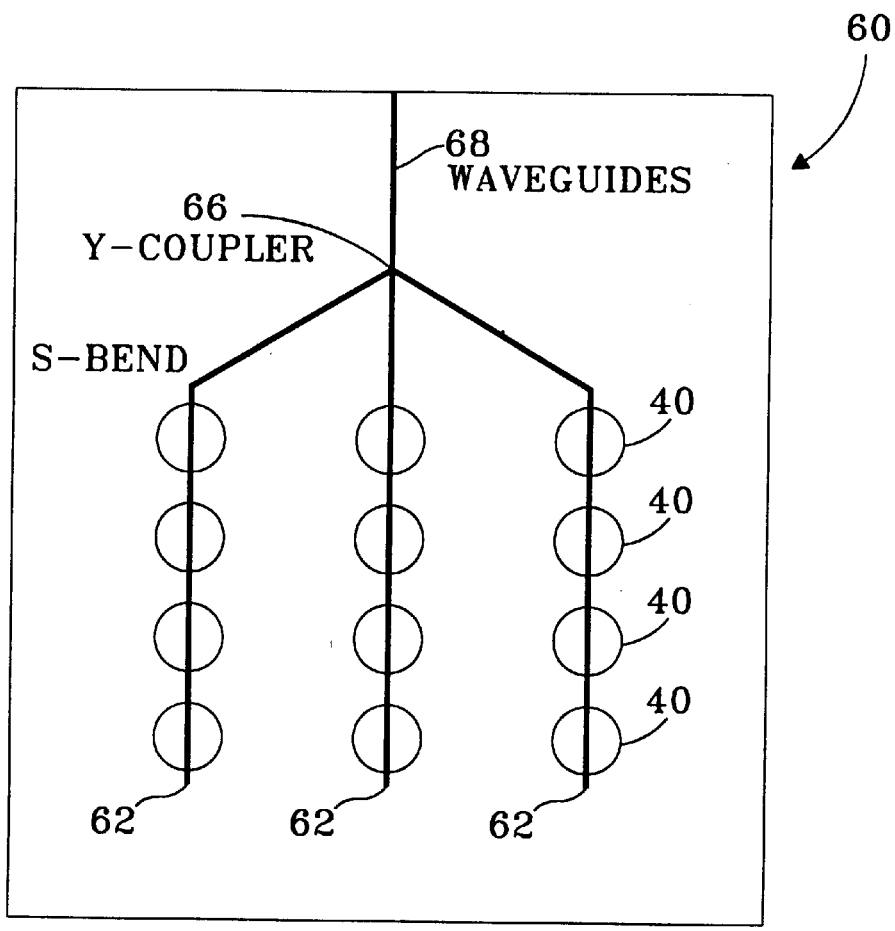
FIG. 12b shows a top view of a 3×4 discharge array of the present invention and optical waveguides for collecting the discharge emission, in which the waveguide transverse dimension is smaller than the microdischarge diameter for purposes of illustration.

The highly flexible semiconductor fabrication techniques used to make the planar electrode devices also permit the easy arrangement of the planar devices into well defined rows. An illustrative array 60 with a row arrangement of planar discharges 40 is shown in FIG. 12b. Emissions from separate rows are collected by parallel waveguides 62, directed through an S-bend, and combined via Y coupler 66 into a central waveguide 68. Such an arrangement permits emission concentration into a thin (typically 2–10 $\mu$m thick) optical waveguide. If used as a light source in an optoelectronic circuit, for example, the failure of a few devices over time in an array of a hundred or a thousand represents a small change in light production that should have no adverse impact on overall operation. Artisans will also appreciate that the incoherent light source provided by the invention is easier to fabricate and less sensitive to aging mechanisms than the lasers which form the basis for many optoelectronic circuits and systems.

Planar Electrode Discharge Lamp Array Experimental Data

Exemplary planar devices have been formed in which the dielectric provides an approximate 1 mm separation between the cathode 42 and anode 48. The dielectric in the experiments was glass, but an $SiO_2$ film is preferred in practical application of the device due to its superior electrical characteristics and manufacturing considerations. The anode 48 in the experimental devices was either a 4000 Å thick evaporated nickel film or a 12 $\mu$m electroplated Ni layer. Cylindrical channels of approximately 400 $\mu$m in diameter were cut into the anode and dielectric layers by ultrasonic milling. An anodic bond was then formed between the dielectric and silicon substrate. Experimental data were obtained at room temperature with a static gas fill and the discharge elements were driven in parallel with a single ballast.

Figure 13:
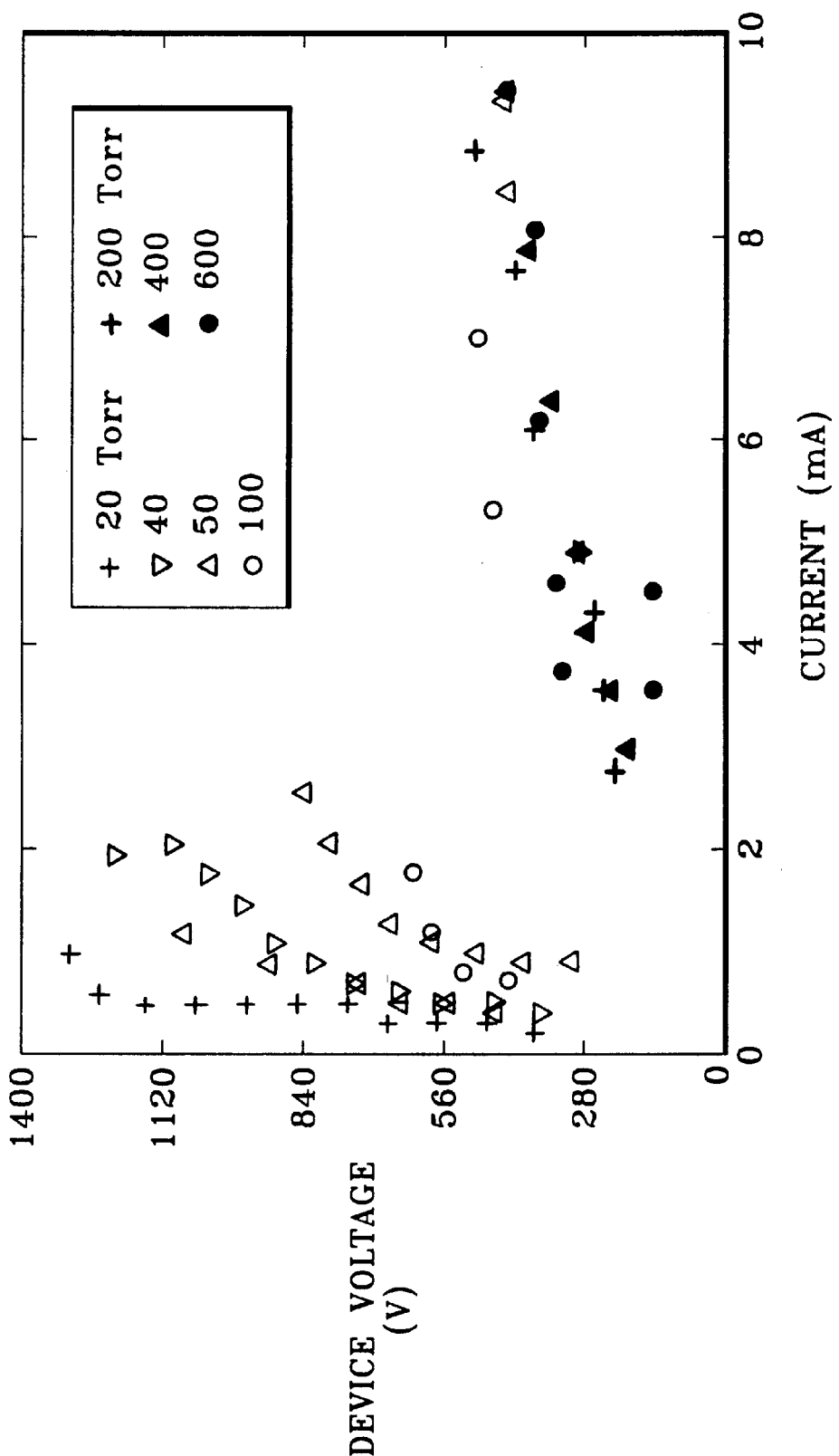
FIG. 13 is a plot of IV characteristics for a planar electrode microdischarge of the invention for Ne pressures between 20 and 600 Torr and a cylindrical microcavity diameter of 400 $\mu$m.
Figure 14:
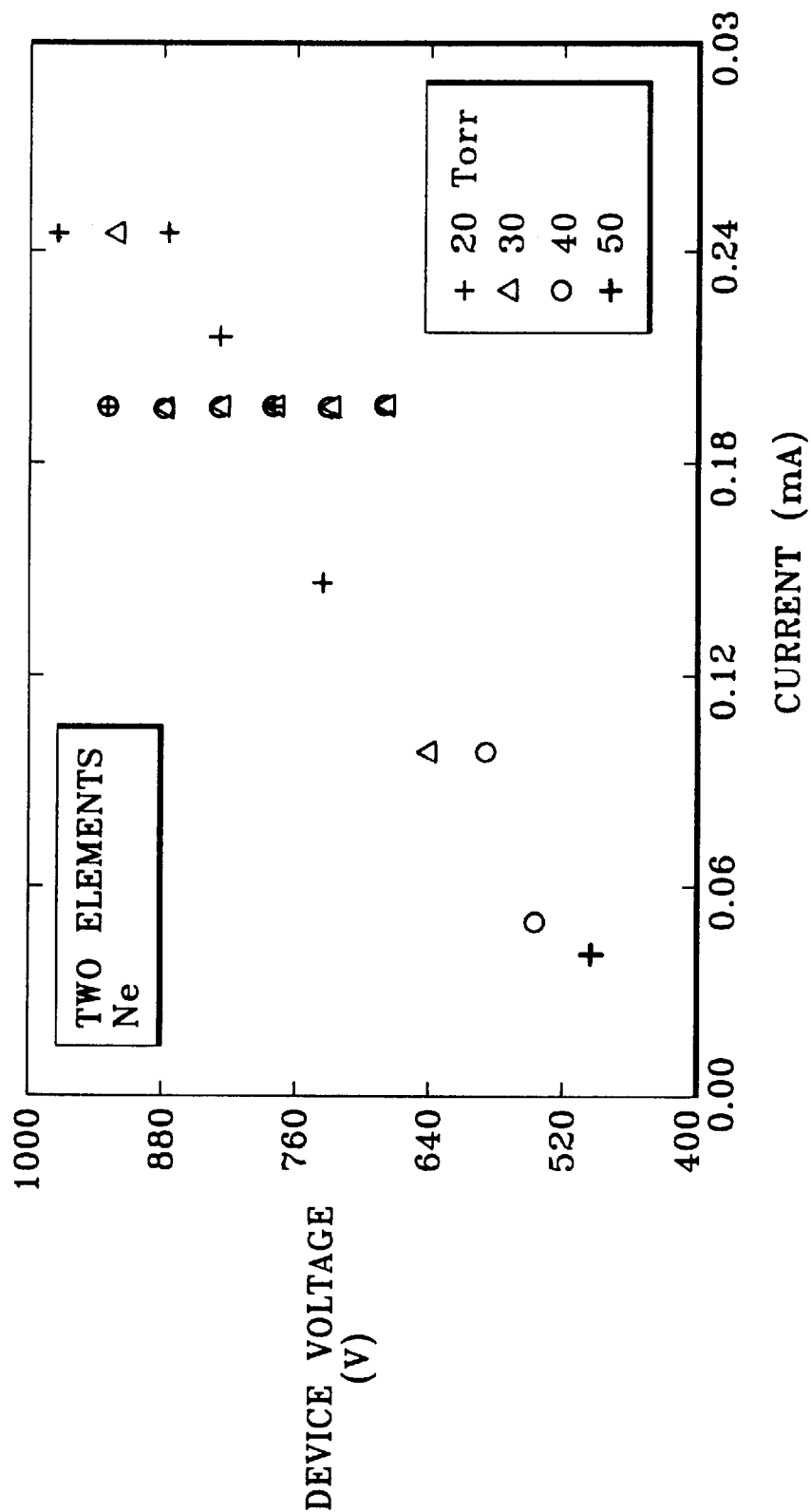
FIG. 14 is a plot of IV characteristics for two 400 $\mu$m diameter planar electrode discharges of the invention spaced by 1.2 mm and operating at 20–50 Torr of Ne for currents up to 0.25 mA.

IV characteristics for a single discharge element are presented in FIG. 13 for several Ne pressures between 20 and 600 Torr. Two distinct regimes of operation are apparent, both of which are characterized by positive differential resistivities. For gas pressures and currents below ~100 Torr and ~2 mA, respectively, the device voltage is typically greater than 400 V and the discharge resistivity is large (~1 M$\Omega$ for $p_{Ne}$=50 Torr). Operation at higher pressures (100–600 Torr) is characterized by a factor of ~20 decline in the differential resistivity. In the 2–4 mA interval, the discharge voltage is ~180–270 V (for Ne pressures of 200–600 Torr) which is comparable to the scanning and sustaining voltages typical of pixels in plasma display panels. For currents above 9 mA, the specific power loading of the discharge is ~40 kW-cm$^{-3}$. Similar data for two 400 $\mu$m diameter discharges spaced by 1.2 mm and operating at low pressure (20–50 Torr Ne) are given in FIG. 14 for currents up to 0.25 mA and FIG. 15 shows CCD images of two microdischarge arrays.

Figure 15A:
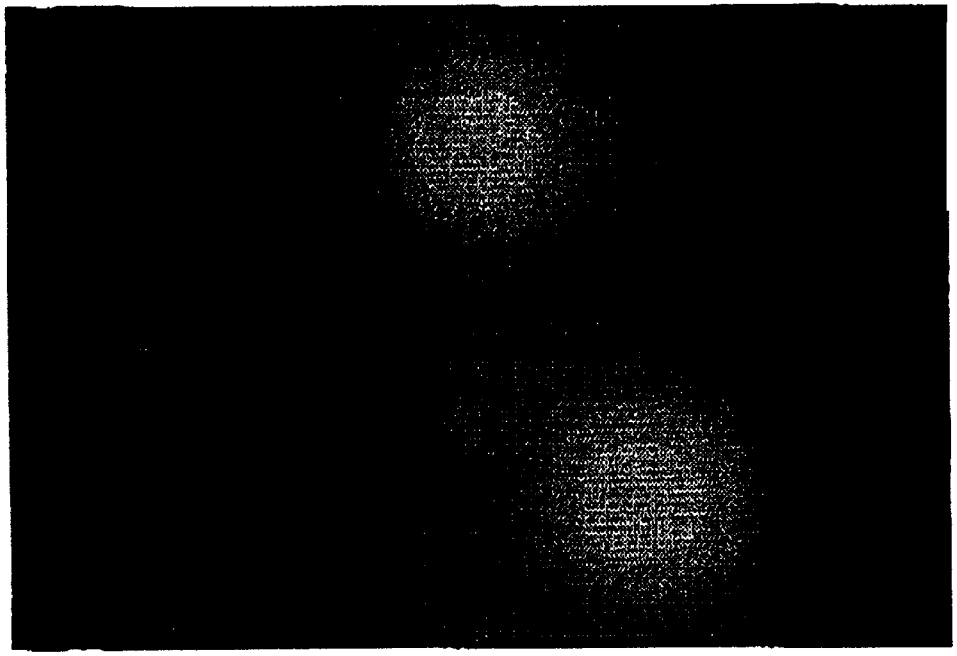
FIG. 15a is a CCD camera image of a two element planar electrode device of the invention operating at 0.15 mA and 20 Torr Ne.
Figure 15B:
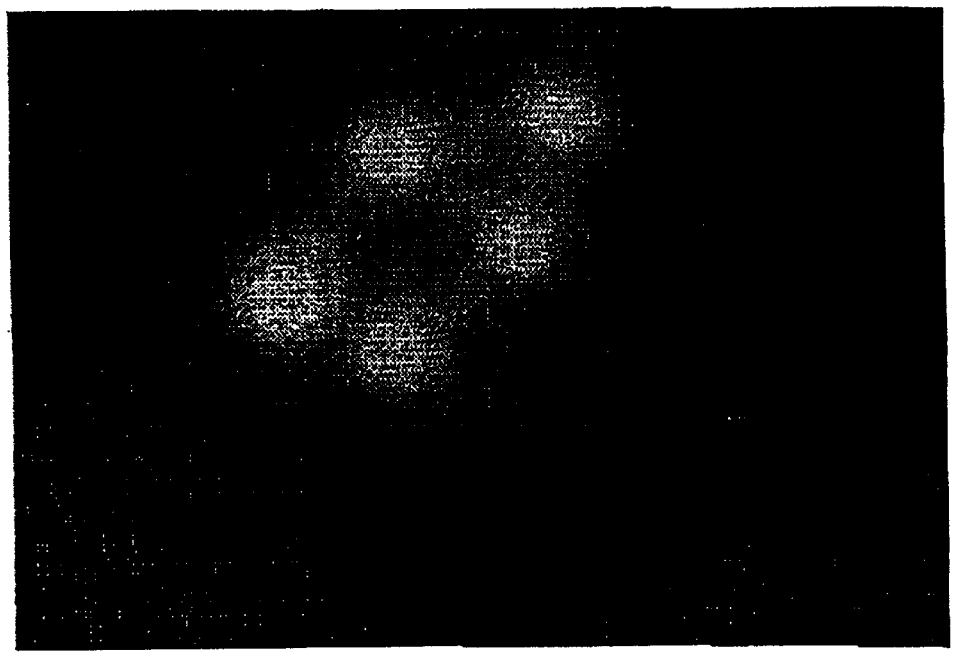
FIG. 15b is an image of a five element planar electrode device of the invention operating at 0.11 mA and 17 Torr Ne.

FIG. 15a is an image of a two element device operating with a discharge current of 0.15 mA and a Ne pressure of 20 Torr. A five element array in which the element spacing (~1–1.5 mm) was varied is pictured in FIG. 15b. The gas pressure and discharge current for the five element array are 17 Torr of Ne and 0.11 mA, respectively, and coupling of the discharges of adjacent devices, presumably due to stray capacitance, is noticeable. Both of the devices in FIG. 15 were fabricated with a 0.4 $\mu$m thick Ni anode and stable operation of the arrays was readily obtained over the full range of pressures and currents of FIG. 14. At higher pressures and currents (>0.3 mA), differences in intensity among the array elements were evident. Arrays consisting of discharge devices having the thick (12 $\mu$m) electroplated Ni anode layer were operated at an element spacing of 0.8 mm and no coupling between adjacent discharges was observed. Both rare gas and XeI molecule (254 nm) continuous emissions have been generated in the planar electrode devices of the invention.

Such devices and other devices may be formed incorporating the discharge device according to the present invention. From the above description, artisans will appreciate that the microdischarge lamp of the present invention provides many advantages. The full scope of the invention is not limited to the illustrated embodiments, however, but is determinable with reference to the appended claims and their legal equivalents.

What is claimed is:

1. A discharge device comprising:
  a semiconductor substrate;
  a dielectric formed upon said substrate;
  an anode electrically isolated from said substrate by said dielectric;
  a microcavity penetrating said dielectric and said anode, and electrically contacting said substrate;
  a cathode electrically contacting said microcavity; and
  discharge filler within said microcavity.

2. A discharge device according to claim 1, wherein said cathode is formed in a semiconductor region of said substrate which electrically contacts said microcavity.

3. A discharge device according to claim 2, wherein said substrate is a silicon wafer.

4. A discharge device according to claim 2, wherein said microcavity has a maximum aperture in the approximate range of about 1 to 400 $\mu$m.

5. A discharge device according to claim 1, wherein said microcavity has a maximum aperture of in the approximate range of about 1 to 400 $\mu$m.

6. A discharge device according to claim 1, wherein said dielectric comprises a layer formed upon said substrate and said anode comprises a conductive layer formed upon said dielectric.

7. A discharge device according to claim 6, wherein said dielectric comprises $SiO_2$.

8. A discharge device according to claim 6, further comprising additional microcavities penetrating said dielectric and anode and forming an array with said microcavity.

9. A discharge device according to claim 1, farther comprising additional microcavities penetrating said dielectric and anode and forming an array with said microcavity.

10. A discharge device according to claim 9, further comprising a waveguide in optical communication with at least two of said microcavity and said additional microcavities.

11. A discharge device according to claim 1, wherein said substrate comprises a film on a substrate base.

12. A discharge device comprising:

a semiconductor planar cathode layer;

a planar dielectric layer formed upon said cathode layer;

a planar conductive anode layer formed upon said dielectric layer;

at least one microcavity penetrating through said dielectric layer to expose a portion of said planar cathode layer for electrical contact, and in electrical contact with said anode layer; and discharge filler contained within said microcavity and electrically contacting said portion of said planar cathode layer.

13. A discharge device according to claim 12, wherein said microcavity comprises a channel.

14. A discharge device according to claim 12, wherein said microcavity comprises a cylindrical hole.

15. A discharge device according to claim 12, further comprising a waveguide layer formed upon said anode layer and in optical communication with said microcavity.

16. A discharge device according to claim 12, wherein said dielectric layer is millimetric in thickness.

17. A discharge device according to claim 12, wherein said microcavity penetrates said anode layer.

18. A discharge device according to claim 12, wherein said microcavity comprises a microchannel and said device includes a plurality of microchannels to form an array.

* * * * *